United States Patent [19]

Johnson

[11] Patent Number: 4,557,382
[45] Date of Patent: Dec. 10, 1985

[54] DISK PACKAGE

[75] Inventor: Douglas M. Johnson, Waconia, Minn.

[73] Assignee: Empak Inc., Chanhassen, Minn.

[21] Appl. No.: 523,850

[22] Filed: Aug. 17, 1983

[51] Int. Cl.$^4$ ............................................. B65D 85/57
[52] U.S. Cl. ..................................... 206/444; 206/334;
 206/454; 206/509; 211/40
[58] Field of Search ........ 206/309, 444, 445, 328–334,
 206/454, 455, 509; 211/40, 41; 220/22

[56] References Cited

U.S. PATENT DOCUMENTS

| D. 260,237 | 8/1981 | Fuzere | 206/334 |
|---|---|---|---|
| 2,873,875 | 2/1959 | Layton, Jr. et al. | 206/509 |
| 3,467,242 | 9/1969 | Rousse | 206/334 |
| 3,534,862 | 10/1970 | Shambelan | 206/332 |
| 3,850,296 | 11/1974 | Hirata et al. | 206/334 |
| 3,877,134 | 4/1975 | Shanahan | 211/41 |
| 3,923,156 | 12/1975 | Wallestad | 206/328 |
| 3,926,305 | 12/1975 | Wallestad | 206/334 |
| 3,934,733 | 1/1976 | Worden | 206/328 |
| 3,939,973 | 2/1976 | Wallestad | 206/328 |
| 3,949,891 | 4/1976 | Butler | 211/41 |
| 3,961,877 | 6/1976 | Johnson | 206/454 |
| 4,043,451 | 8/1977 | Johnson | 206/334 |
| 4,061,228 | 12/1977 | Johnson | 206/334 |
| 4,091,919 | 5/1978 | MacLeod et al. | 206/334 |
| 4,135,625 | 1/1979 | Merrill | 206/332 |
| 4,160,504 | 7/1979 | Kudlich et al. | 206/334 |
| 4,171,740 | 10/1979 | Clement et al. | 206/454 |
| 4,176,751 | 12/1979 | Gillissie | 206/328 |
| 4,248,346 | 2/1981 | Johnson | 206/334 |

Primary Examiner—George E. Lowrance
Assistant Examiner—Jimmy G. Foster
Attorney, Agent, or Firm—Hugh D. Jaeger

[57] ABSTRACT

A disk package for memory disks and the like and including a top cover, a disk cassette, and a bottom cover where the top cover includes sides with hooks which engage about catches on the box, and the bottom cover includes a channel which frictionally engages to the bottom edges of the box. The disk cassette supports a plurality of memory disks through perimeter contact of a rounded side and separated by teeth. The top cover includes a plurality of fingers which extend downwardly from the top cover, the fingers movable with respect to each other for engaging each disk independently of each other. The disks are separated by teeth having a rounded profile and a flat portion therebetween for perimeter contact with the disks, the teeth being longitudinal in length and running about the rounded sides and sides of the box.

2 Claims, 10 Drawing Figures

DISK PACKAGE

BACKGROUND OF THE INVENTION

1. Field of the Invention

The present invention pertains to a package, and more particularly pertains to a disk package for transportation and storage of memory disks where the disk cassette component can be used with newly developed robotic equipment for automatic disk placement.

2. Description of the Prior Art

The prior art packages for shipment and storage of memory disks have exhibited certain deficiencies throughout the development of state-of-the-art memory disks.

One of the deficiencies of the prior art packages was a secure package not only for holding and transporting the memory disk, but also for subsequent placement through processing machinery and the like. The subsequent packages caused lost time and motion, and often resulted in scratching of the memory disks during transportation and transfer thereafter.

The prior art packages could not provide for automated stacking and did not allow for random access of the disks. The prior art containers required that all disks had to be removed to obtain one which was stacked in-between. The handwork picking of wafers resulted in scratched surfaces.

The prior art cassettes resembled cake-pan configurations with shims between the disk and a translucent shroud, something like a turkey roaster.

The present invention overcomes the disadvantages of the prior art by providing a disk package including a disk cassette which protects both sides of the smooth disk and critical coated surfaces of the disk. The disc cassette allows for random access of any particular disk. The present invention also overcomes the disadvantages of the prior art by providing a package for shipment and processing of memory disks. This package includes a top cover, a disk box, and a bottom cover which interlock and interengage with respect to each other, providing for securing of a plurality of memory disks in a safe and uncontaminated package. The package provides for full profile depth for the memory disks for maximum safety.

SUMMARY OF THE INVENTION

The present invention provides a memory disk package including three interengaging components of top cover, a disk cassette, and a bottom cover, which include a flush perimeter and provide for full-depth profile. The disk boxes are stackable with or without disks, and with or without the bottom or top covers engaged thereto. The disk boxes provide for perimeter contact and support of the memory disks as well as high profile and depth protection of the disks. The disc cassette provides a linear design function.

According to one embodiment of the present invention, there is provided a disk package including three components of a top cover, a disk cassette, and a bottom cover, the disk box including lower sides, ends attached thereto, rounded sides affixed to and extending upward from said lower sides to a planar side, an overlapping perimeter affixed about the planar sides, relief areas in the ends of the boxes, vertical edges extending at each end, rounded catch edges extending about the relief areas, and a plurality of rounded teeth with a flat truncated portion between each tooth opposing each other about the rounded and planar sides, in stacking indentations above the vertical edges on the overlapping perimeter, the bottom cover including a substantially planar member with an interior draft portion, a perimeter thereabout with a channel formed therein and encompassing corner edges about the perimeter on each of the corners, the top cover including a substantially planar member with the outer draft extending upward, a plurality of independent downwardly extending fingers opposing each other in two rows, each of the fingers including a V groove and a slot extending slightly upward therefrom, and each of the fingers separated from the other fingers in each of said respective rows by longitudinal slots, a perimeter surrounding the edge of the cover, ends extending downward and slightly therein and including locking catches about the rounded circumferences thereof on the ends whereby the bottom cover frictionally engages to the disk box and the top cover frictionally latches to the sides of the disk box, thereby providing a secure disk package for transportation, storage and processing of memory disk.

The disk cassette importantly functions as a cassette for processing and handling disks prior to, and, or the shipment process. The disk cassette, or what can also be referred to as disk box, provides a linear designed function for encompassing of the disks. The disk cassette is designed to allow the cassette to be utilized in an upright position during automated processing where the disks are in a horizontal mode while the cassette is utilized in an elevator for disk insertion or removal.

The manufacturer of the disks and the disk coater can utilize the disk cassette in a true cassette function. The disk maker may have to ship the disks to the disk coater where the disk cassette and covers provide for shipment as well as storage. The end-use customer may discard the top and bottom covers while using the disk cassette for storage as a disk box or during processing of the disks. The disk cassette most importantly functions as a cassette for processing and handling disks prior to shipment function or during the automated processing function.

One significant aspect and feature of the present invention is a package for memory disks which provides for transportation and storage of the disks as well as processing.

Another significant aspect and feature of the present invention is a package for memory disks where the disk box is stackable and the disk package is stackable, or any stackable combination of the top cover, the disk box, or the bottom cover.

A further significant aspect and feature of the present invention is a disk package with smooth surfaces and rounded corners for enhancement of automated processing. The rounded exterior corners especially assure that individuals handling the packages will not be cut, and, further, the rounded corners provide for shrink-wrapping which is so ever popular.

Having thus described embodiments of the present invention, it is a principal object hereof to provide a package for memory disks.

One object of the present invention is to provide a package for memory disks which provides for a secure package for transportation, storage and processing of memory disks.

Another object of the present invention is to provide a disk package for memory disks where the disc package provides a disk cassette which is utilizable by the maker of the disk, the disk coater, during storage, and by the end-use customer.

A further object of the present invention is to provide a package for memory disks, and which also can be utilized for wafers as so desired.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF PREFERRED EMBODIMENTS

Figure 1:
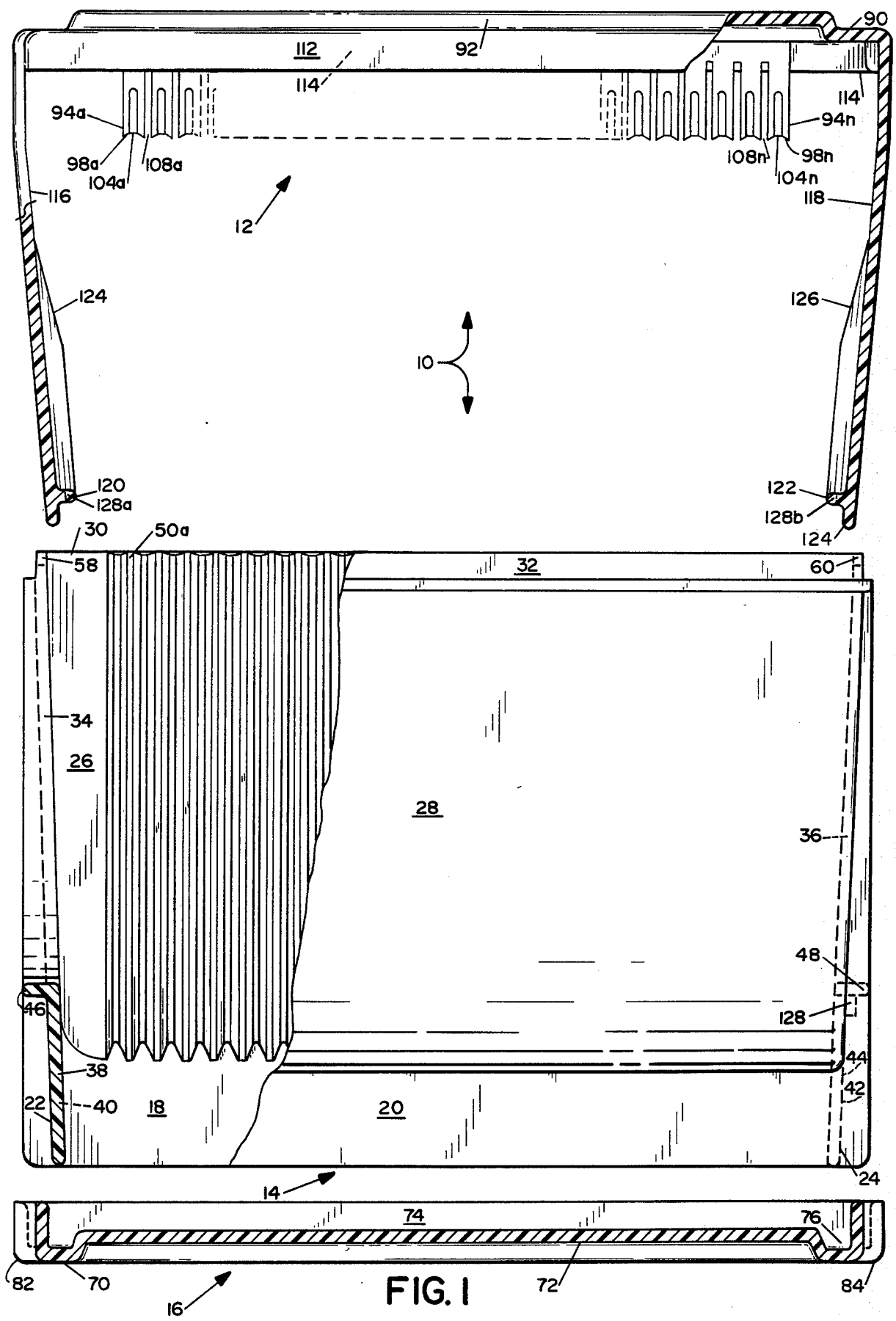
FIG. 1 illustrates a plan view of a disk package, the present invention, illustrating the three separated components of a top cover, a box, and a bottom cover.

FIG. 1 illustrates a plan view of the disk package 10 including a top cover 12, a disk cassette or disc box 14, and a bottom cover 16. The disk cassette is for supporting a plurality of memory disks for computer applications in a closed and packaged environment. The disk cassette 14 is now described in detail and with respect to FIGS. 2 and 3.

Figure 2:
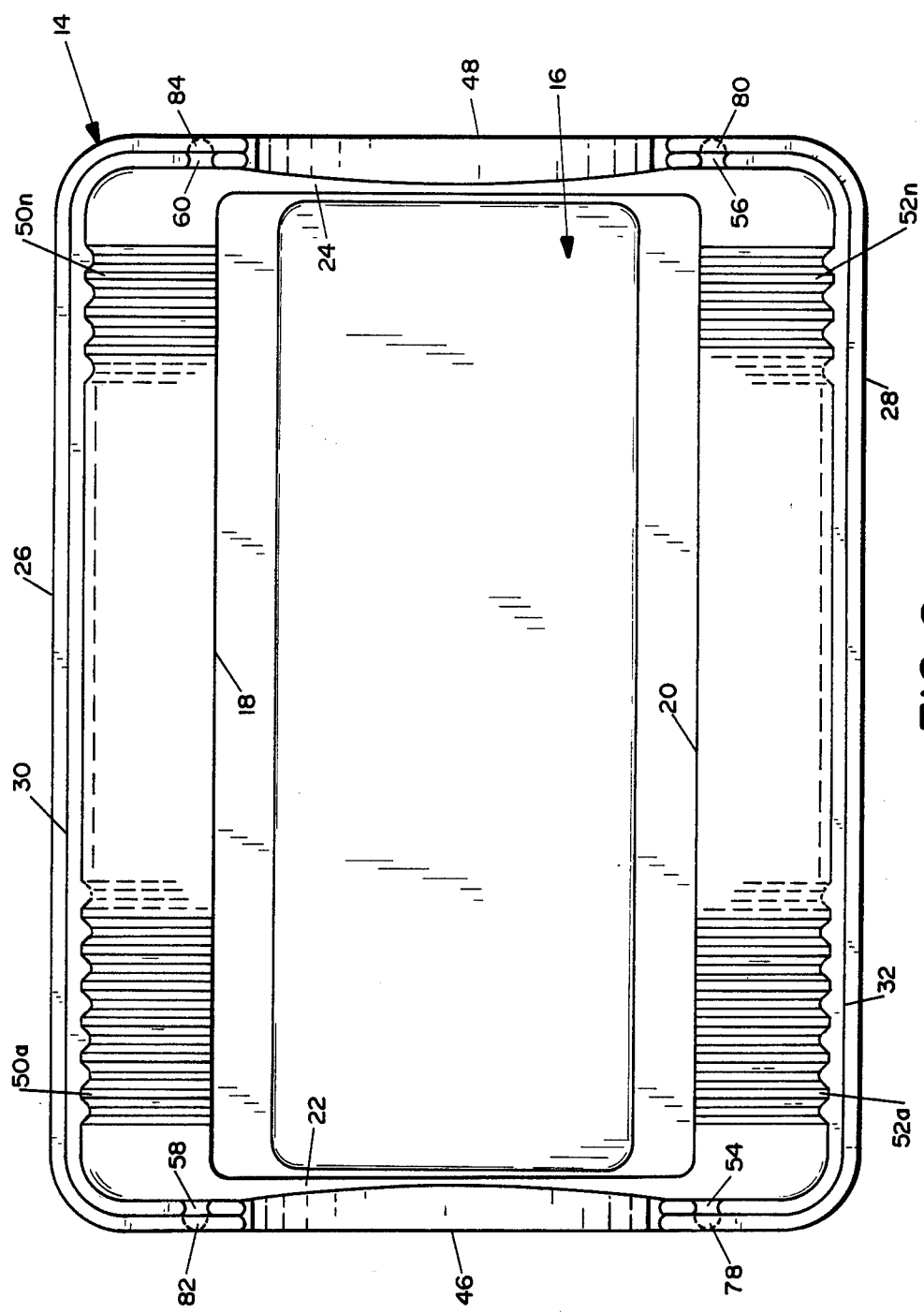
FIG. 2 illustrates a top view of the box and the bottom cover engaged with respect to each other.
Figure 3:
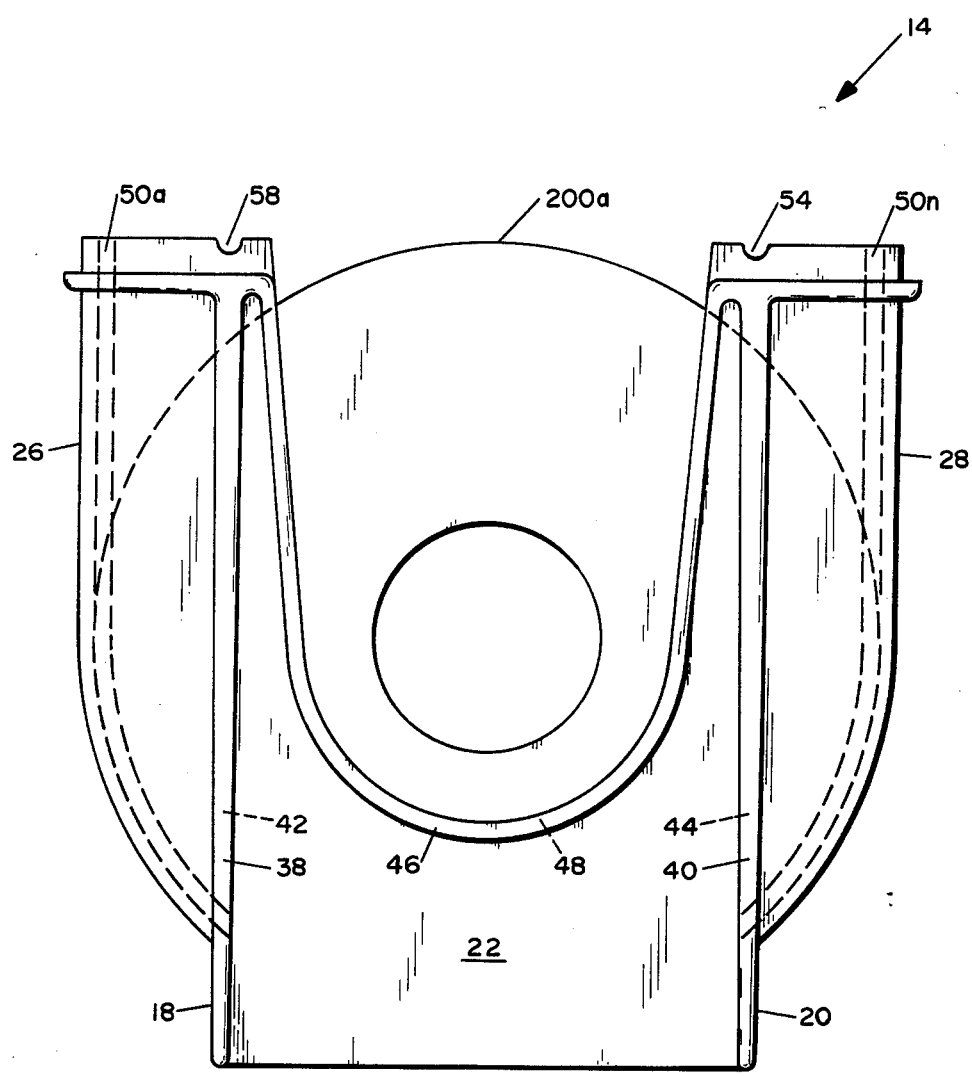
FIG. 3 illustrates an end view of the box.

The disk cassette 14 includes lower opposing edges 18 and 20, opposing ends 22 and 24, rounded disc supporting sides 26 and 28, and overlapping perimeters 30 and 32. Relief areas 34 and 36 are provided for disk access. Vertical edges 38, 40, 42 and 44 are provided for support as well as stacking, as later described in detail in FIGS. 7A and 7B. Rounded edges 46 and 48 are provided as catch edges. A plurality of saw-tooth teeth 50a–50n and 52a–52n are provided opposing each other on the rounded sides 26 and 28 for supporting of the disks, especially in perimeter contact about a lower portion of the rounded sides 26 and 28. This perimeter contact is also illustrated in FIG. 3. Stacking indentations 54, 56, 58 and 60 are provided about the overlapping perimeter 30 and 32 as illustrated in FIG. 2. Reference is made to the opposing ends 22 and 24 which are angular, exposing of the catches 46 and 48 as well as the rounded catch edges in their entirety.

With regard to the rounded tooth configuration, the tooth profile can take a ramped configuration or, more appropriately, a sine wave configuration with the lower half of the sine wave truncated to provide for perimeter contact with the disk edge. The truncation of the sine wave is proportional to the width of the disk edge. The capacity of the disks in the box is dependent of course upon the distance between the disks and-or the height of the box, but can range from 10 to 50, or more, preferred in the range of 14 to 25.

The disk cassette 14 includes numbering of the pockets for individual identification of each disk, and will have various capacities such as 20, 14, 25, 25, or any other number of disks which is dependent upon the distance between the disks and-or the size of the package.

In a broader sense, "disk" is considered to be a substrate, as the package will accommodate memory disks or in the broad sense, substrate.

In numbering of the pockets, the number will range from 1-n, from left to right, with a locating key positioned adjacent the last numbered pocket.

The bottom cover 16 includes a substantially planar member 70 with a draft 72 therein for purposes of stacking, a perimeter 74, and four encompassing corners 78, 80, 82 and 84 for encompassing and frictionally engaging the lower edges of the box. The channel 76 provides for an environmental as well as frictional engagement seal.

The top cover 12 includes a substantially planar member 90, an outer draft area 92, a plurality of opposing fingers 94a–94n and 96a–96n, each of the fingers including a respective V groove 98a–98n and 100a–100n, a web 104a–104n and 106a–106n through each finger, and long slots 108a–108n and 110a–110n where the web provides for engagement with the perimeter of the disk and the long slots provide for independent action of each finger with respect to the disk. Opposing perimeters 112 and 114 are provided on each side of the planar member and overlap about the short ends. Ends 116 and 118 take a substantially oval configuration and include locking catches 120 and 122 respectively. The locking catches 120 and 122 are tapered at ends 124 and 126.

FIG. 2 illustrates a top view of the bottom cover 16 engaged to the disk cassette 14 where all numerals correspond to those elements previously described.

FIG. 3 illustrates an end view of the box 14 where all numerals correspond to those elements previously described. Particularly illustrated is one disk 200a showing the perimeter contact between the rounded sides 26 and 28 and the edges of the disk 200a.

Figure 4:
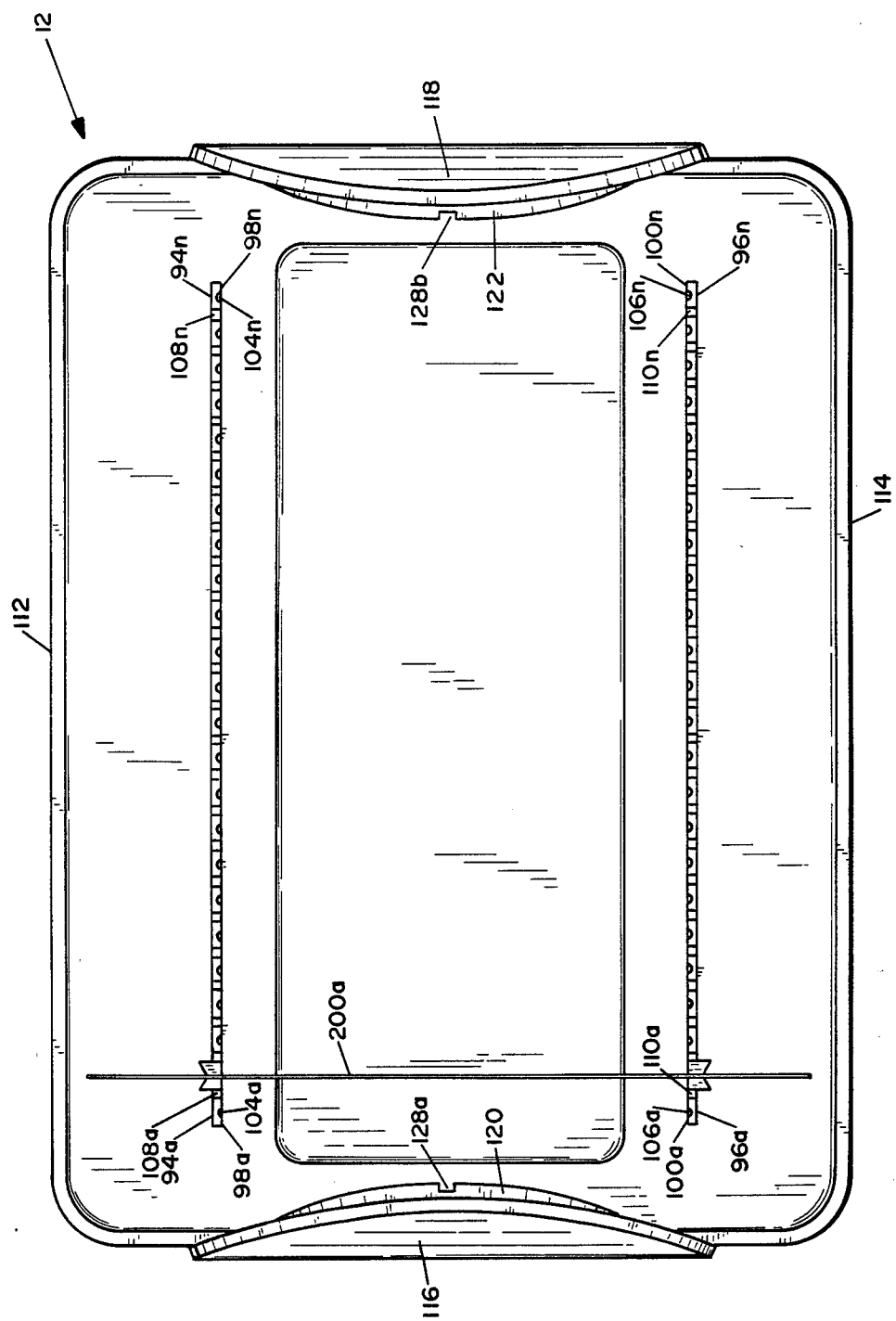
FIG. 4 illustrates a bottom view of the top cover.

FIG. 4 illustrates a bottom view of the top cover 12 where all numerals correspond to those elements previously described. It is noted that the top cover locking mechanisms including the locking catches 120 and 122 and the ends 116 and 118 are angled inwardly, providing for spring action locking about the rounded catch edges 46 and 48. This inward projection provides for spring action between the rounded catch hooks 46 and 48 and the locking catches 120 and 122 for engagement by the ends of the top cover 12 to the ends of the disk cassette 14.

MODE OF OPERATION

Figure 5:
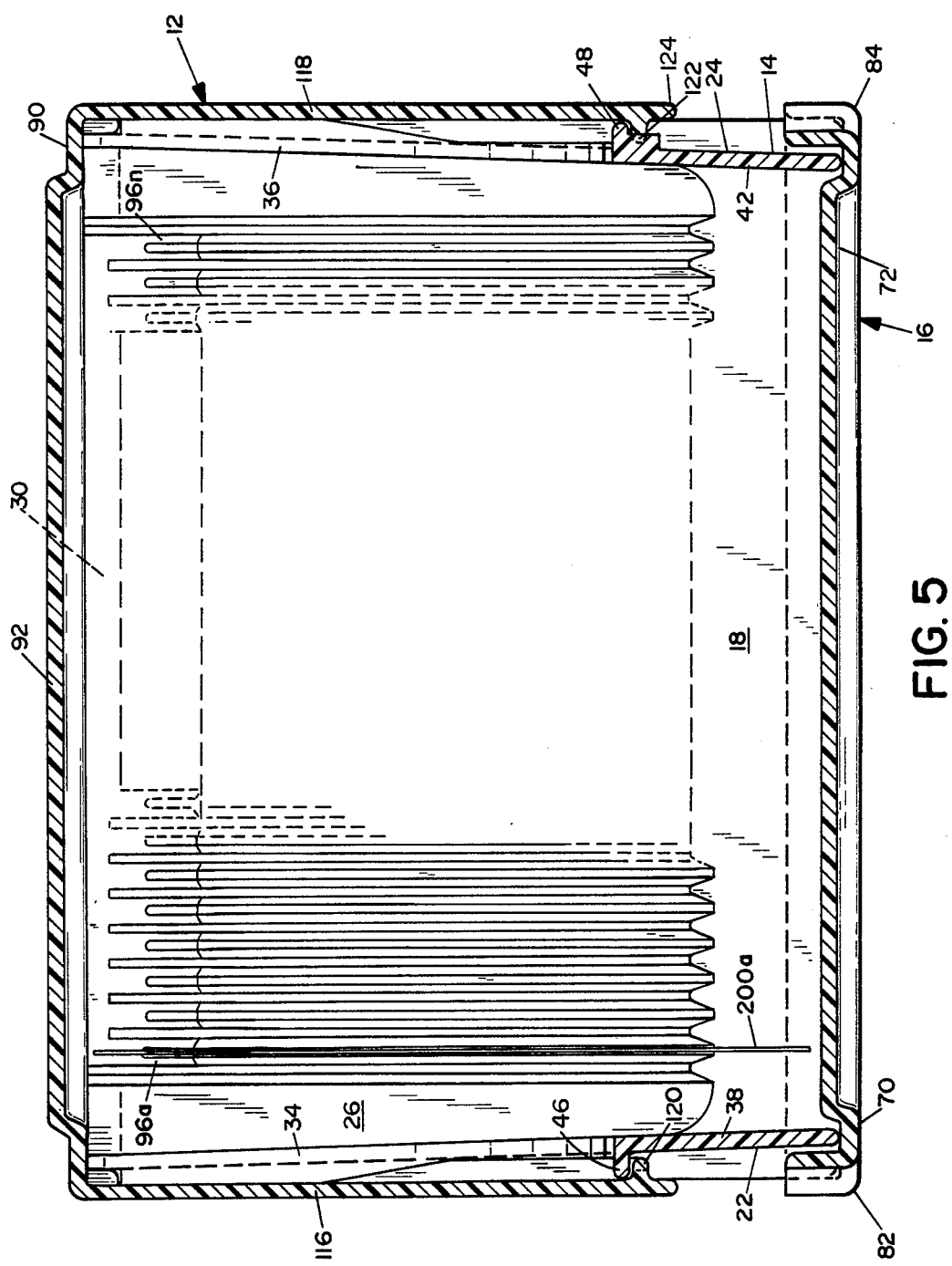
FIG. 5 illustrates a plan side view of the disc package with the top cover, the box, and the bottom cover engaged with respect to each other.

FIG. 5 illustrates a sectional side view of the disk package 10 with the three components of the disk cassette 14, top cover 12 and bottom cover 16 engaged with respect to each other. Particularly noted is the complete seal and flush perimeter about the ends and edges of the box. Also noted is the frictional engagement between the bottom and top edges of the box 14 with respect to the top cover 12 and the bottom cover 16.

The figure particularly shows the action of the locking hooks 120 and 122 with respect to the rounded catch edges 46 and 48.

The corners and surfaces of the package 10 are designed for shrink-wrapping, which is the standard process for sealing of containers/packages in the integrated circuit industry. The package 10 is designed with smooth surfaces and rounded corners which enhances cleaning of the package components. The exterior corners, which are rounded and smooth, provide for shrink-wrapping as well as safety to the handler of the package and components.

The memory disks have a round center hole. The openings on both ends of the disk cassette are larger than the hole in the memory disk so that robots and automatic processing machinery can attach and engage to the disk hole. This is the preferred perimeter in making physical contact with the memory disc because the recording surfaces, both sides of the disc, are extremely critical and sensitive. The automatic processing machinery may include a robot which is an arbor type that expands or, in the alternative, a suction cup slightly larger than the hole of the disk for attachment, or by a collet in the alternative.

The edges 18 and 20 and 46 of the cassette provide a bearing surface for good stability against any machine vibration when the cassette is used in an upright position during automated processing. A key 128 is provided on the No. 25 pocket end which interfaces with keyways on automated processing machines so that the operator is able to index on the correct end of the cassette during the automated processing step. Both ends of the cover are recessed for accommodating the key so that the cover will engage either way about the key at the number 25 or end of the cassette. The pockets have not been numbered for sake of brevity in the drawings, but the last numbered pocket is adjacent the key.

Figure 6:
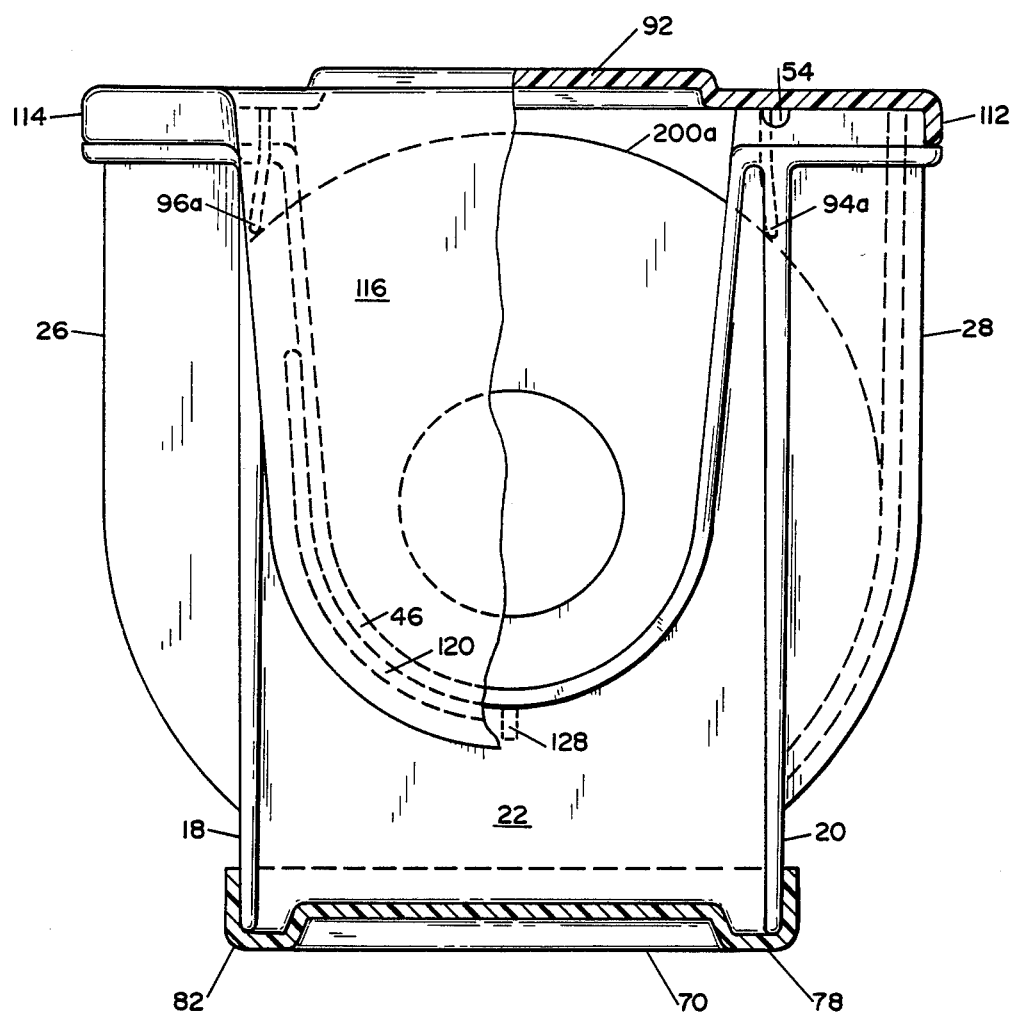
FIG. 6 illustrates an end view of FIG. 5.

FIG. 6 illustrates an end view showing actuation of the fingers against a disk. The figure also illustrates the interrelationship of the three components engaging with respect to each other.

Figure 7A:
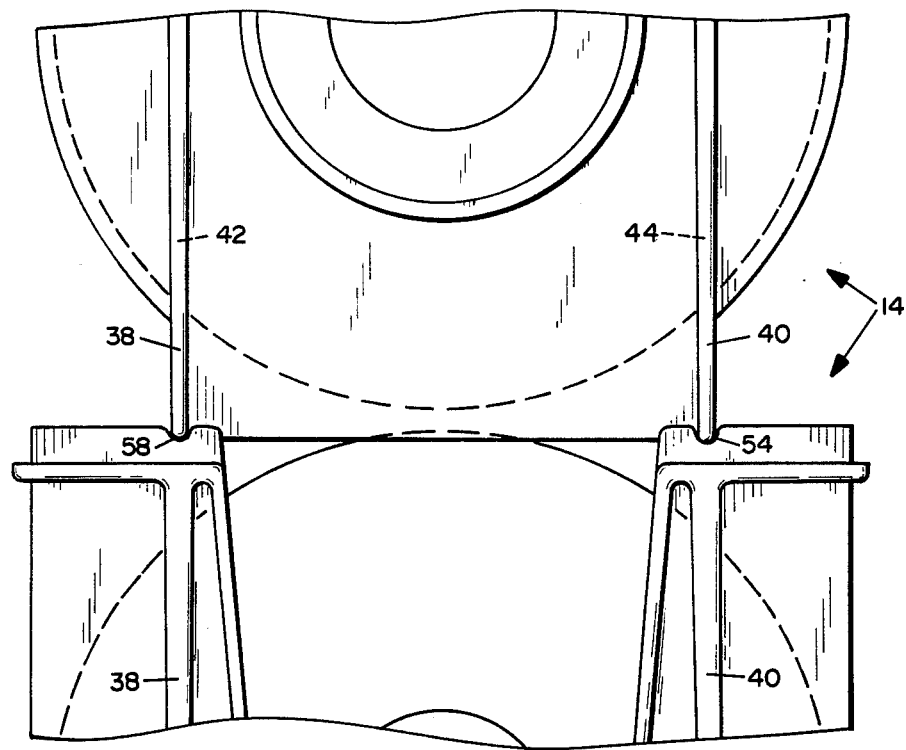
FIGS. 7A and 7B illustrate the boxes stacked with respect to each other.
Figure 7B:
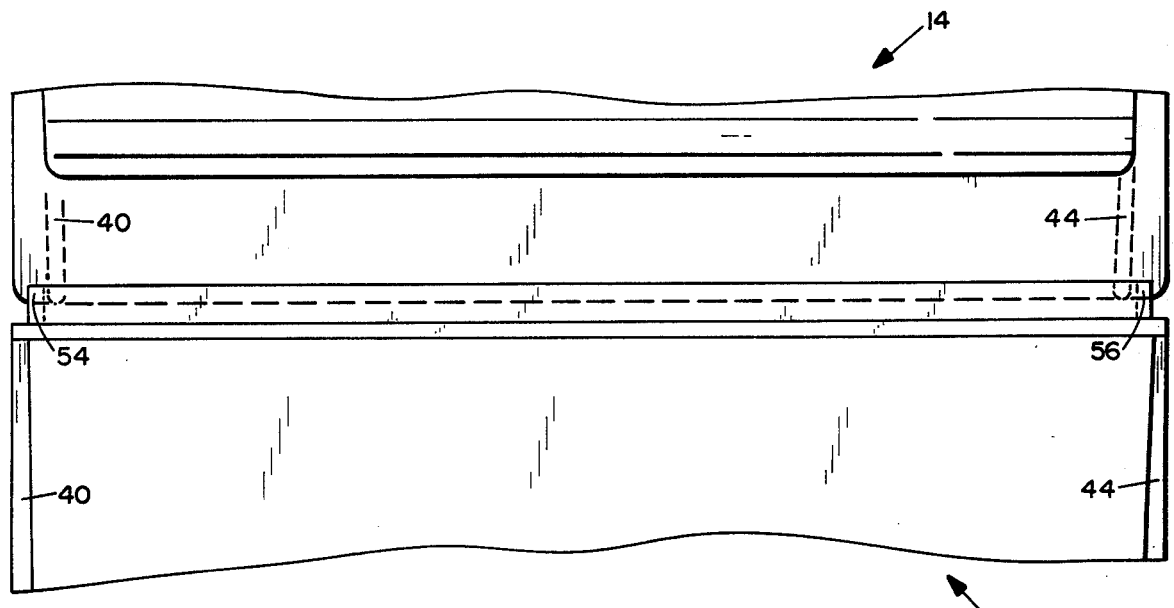

FIGS. 7A and 7B illustrate the stacking of the boxes 14 where the ends and sides fit into the stacking indentations of the respective lower box.

Figure 7C:
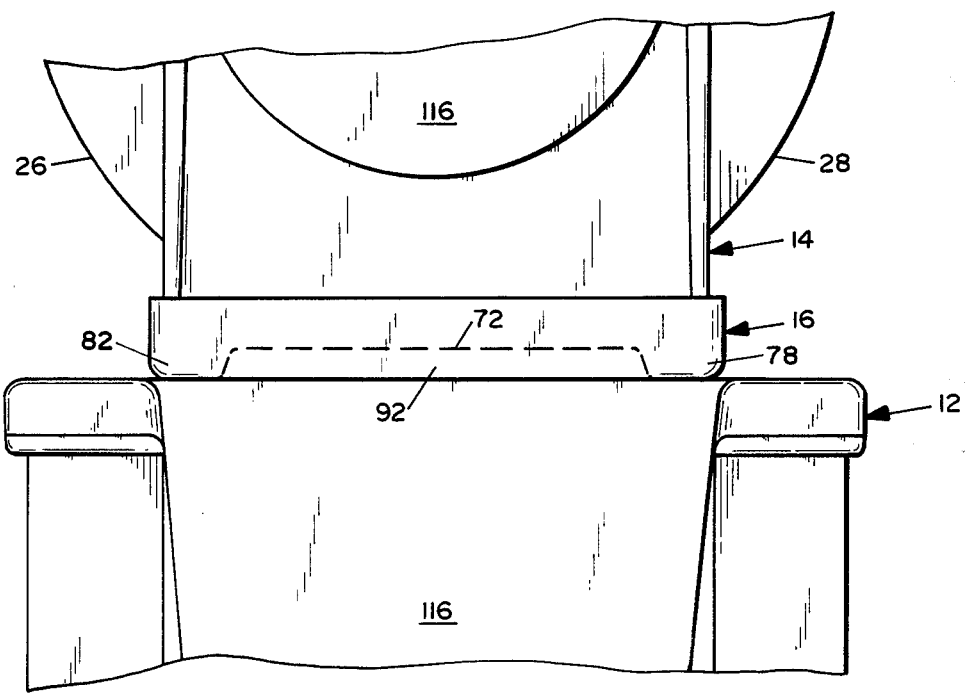
FIGS. 7C and 7D illustrate the disk packages stacked with respect to each other.
Figure 7D:
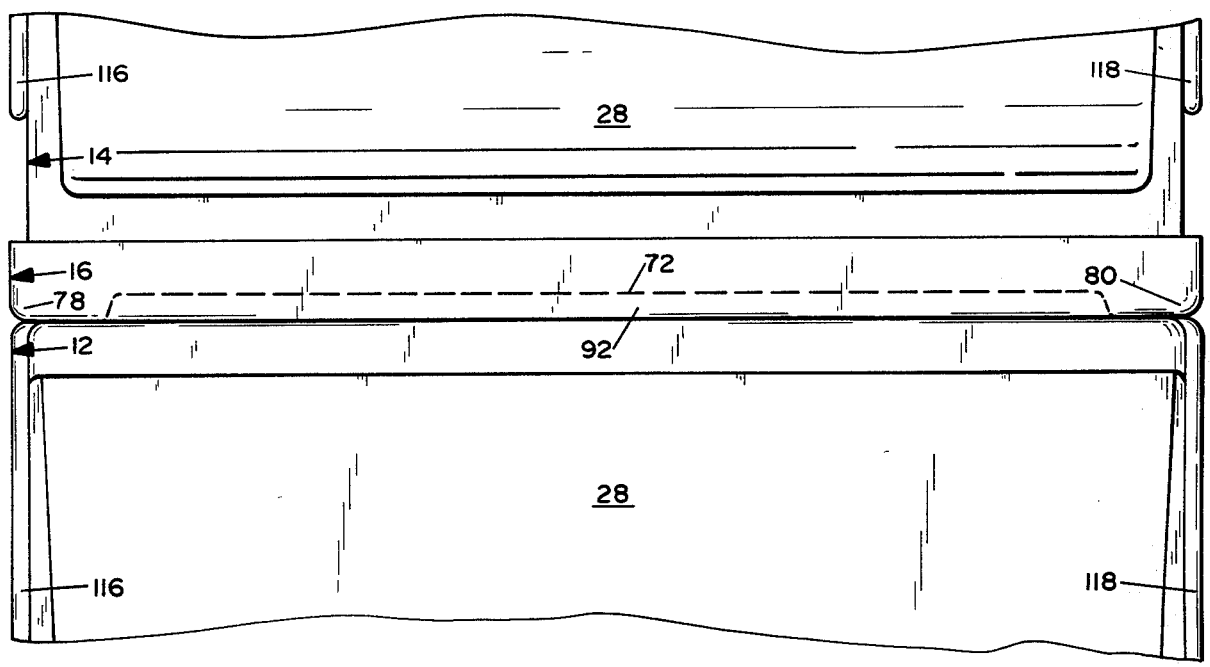

FIGS. 7C and 7D illustrate stacking of the packages 10 where the top exterior draft of the top cover engages and mates with the bottom interior draft of the bottom cover, providing for engagement with respect to each other, based on the overlapping members in the stacking relationship.

Grooves are provided in both ends of the top cover sides to accept the key.

I claim:

1. Package for memory disks comprising:
a. disk cassette including lower opposing edges, opposing ends affixed to said edges, rounded disk supporting sides affixed to said lower edges, and overlapping perimeter encompassing each top edge of said rounded disk supporting sides, relief area in each of said ends, vertical edges extending outwardly and downwardly about said ends, rounded catch edges extending outwardly about said relief circumference, a plurality of opposing rounded sawteeth with spaces therebetween positioned on said rounded disk supporting sides of said box and extending inwardly;
b. bottom cover including a bottom substantially planar member, a draft extending into said planar member, a perimeter about said planar member including four encompassing corners and forming a channel therein; and,
c. top cover including a planar member, and outwardly extending draft member, two rows of opposing movable flexible members extending downwardly from said planar member, a downwardly extending perimeter extending about sides and ends of said top planar member, downwardly extending oval ends including rounded circumferences extending slightly inward, and locking catches located about each end of said rounded circumference.

2. Package for memory disks comprising:
a. disk box including lower opposing edges, opposing ends affixed to said edges, rounded disk supporting sides affixed to said lower edges, and overlapping perimeter encompassing each top edge of said rounded disk supporting sides, relief area in each of said ends, vertical edges extending outwardly and downwardly about said ends, rounded catch edges extending outwardly about said relief circumference, a plurality of opposing rounded sawteeth with flat members therebetween positioned on said rounded disk supporting sides of said box and extending inwardly, and a plurality of stacking indentations about corners of said perimeter;
b. bottom cover including a bottom substantially planar member, a draft extending into said planar member, a perimeter about said planar member including four encompassing corners and forming a channel therein; and
c. top cover including a planar member, an outwardly extending draft member, two rows of opposing movable fingers extending downwardly from said planar member, V grooves in each of said fingers, short slots extending from an apex of each said grooves extending slightly downward in said finger, long slots extending downward between each of said fingers, a downward extending perimeter extending about sides and ends of said top planar member, downwardly extending oval ends including rounded circumference extending slightly inward, and locking catches located about each end of said rounded circumferences.

* * * * *